(12) United States Patent
Ross et al.

(10) Patent No.: US 11,762,582 B2
(45) Date of Patent: Sep. 19, 2023

(54) BACKGROUND OPERATIONS IN MEMORY

(71) Applicant: Micron Technology, Inc., Boise, ID (US)

(72) Inventors: Frank F. Ross, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/035,259

(22) Filed: Sep. 28, 2020

(65) Prior Publication Data

US 2021/0011664 A1    Jan. 14, 2021

Related U.S. Application Data

(63) Continuation of application No. 16/290,110, filed on Mar. 1, 2019, now Pat. No. 10,789,015.

(51) Int. Cl.
*G06F 3/06* (2006.01)
*G06F 12/02* (2006.01)

(52) U.S. Cl.
CPC .......... *G06F 3/0659* (2013.01); *G06F 3/0613* (2013.01); *G06F 3/0688* (2013.01); *G06F 12/0253* (2013.01)

(58) Field of Classification Search
CPC .... G06F 3/0659; G06F 3/0613; G06F 3/0688; G06F 12/0253
See application file for complete search history.

(56) References Cited

U.S. PATENT DOCUMENTS

| | | | | |
|---|---|---|---|---|
| 7,133,960 | B1* | 11/2006 | Thompson | G06F 12/0623 711/105 |
| 9,514,827 | B1* | 12/2016 | Nam | G11C 16/0483 |
| 10,380,022 | B2* | 8/2019 | Lee | G06F 12/0871 |
| 2005/0166026 | A1 | 7/2005 | Ware et al. | |
| 2007/0263442 | A1 | 11/2007 | Cornwell et al. | |
| 2008/0005514 | A1* | 1/2008 | Kurokawa | G06F 3/0683 711/163 |
| 2008/0270683 | A1 | 10/2008 | Barth et al. | |
| 2008/0307156 | A1* | 12/2008 | Sinclair | G06F 3/0613 711/E12.078 |
| 2009/0157950 | A1 | 6/2009 | Selinger | |
| 2009/0216926 | A1* | 8/2009 | Matulik | G06F 13/4243 711/E12.001 |
| 2010/0036997 | A1* | 2/2010 | Brewer | G11C 7/1072 711/E12.082 |
| 2016/0011802 | A1* | 1/2016 | Berke | G06F 3/0619 711/166 |

(Continued)

*Primary Examiner* — Tracy A Warren
(74) *Attorney, Agent, or Firm* — Brooks, Cameron & Huebsch, PLLC

(57) ABSTRACT

The present disclosure includes apparatuses and methods related to performing background operations in memory. A memory device can be configured to perform background operations while another memory device in a memory system and/or on a common memory module is busy performing commands received from a host coupled to the memory system and/or common memory module. An example apparatus can include a first memory device, wherein the first memory device can include an array of memory cells and a controller configured to perform a background operation on the first memory device in response to detecting a command from a host to a second memory device.

20 Claims, 8 Drawing Sheets

(56) References Cited

U.S. PATENT DOCUMENTS

| | | | |
|---|---|---|---|
| 2016/0210080 A1* | 7/2016 | Frank | G06F 3/0644 |
| 2016/0239205 A1 | 8/2016 | Rothberg | |
| 2016/0349817 A1* | 12/2016 | Kumar | G06F 3/0647 |
| 2017/0075576 A1 | 3/2017 | Cho | |
| 2017/0242593 A1 | 8/2017 | Riley et al. | |
| 2017/0255383 A1 | 9/2017 | Chang et al. | |
| 2017/0277594 A1* | 9/2017 | Yoon | G06F 11/1451 |
| 2017/0357447 A1 | 12/2017 | Jung | |
| 2017/0371776 A1 | 12/2017 | Riley et al. | |
| 2018/0004422 A1 | 1/2018 | Riley et al. | |
| 2018/0019007 A1* | 1/2018 | Lee | G06F 13/1684 |
| 2018/0059945 A1* | 3/2018 | Helmick | G06F 3/061 |
| 2018/0181494 A1 | 6/2018 | Malladi et al. | |
| 2018/0217750 A1 | 8/2018 | Nguyen et al. | |
| 2018/0246643 A1 | 8/2018 | Jenne et al. | |
| 2018/0246790 A1 | 8/2018 | Sankaranarayanan et al. | |
| 2019/0042150 A1 | 2/2019 | Wells et al. | |
| 2019/0079830 A1* | 3/2019 | Kim | G06F 3/0619 |
| 2019/0278518 A1* | 9/2019 | Byun | G06F 3/0631 |
| 2020/0090729 A1* | 3/2020 | Son | G11C 11/406 |

* cited by examiner

BACKGROUND OPERATIONS IN MEMORY

PRIORITY INFORMATION

This application is a Continuation of U.S. application Ser. No. 16/290,110 filed Mar. 1, 2019, which issues as U.S. Pat. No. 10,789,015 on Sep. 29, 2020, the contents of which are included herein by reference.

TECHNICAL FIELD

The present disclosure relates generally to memory devices, and more particularly, to apparatuses and methods for performing background operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

DETAILED DESCRIPTION

Figure 1A:
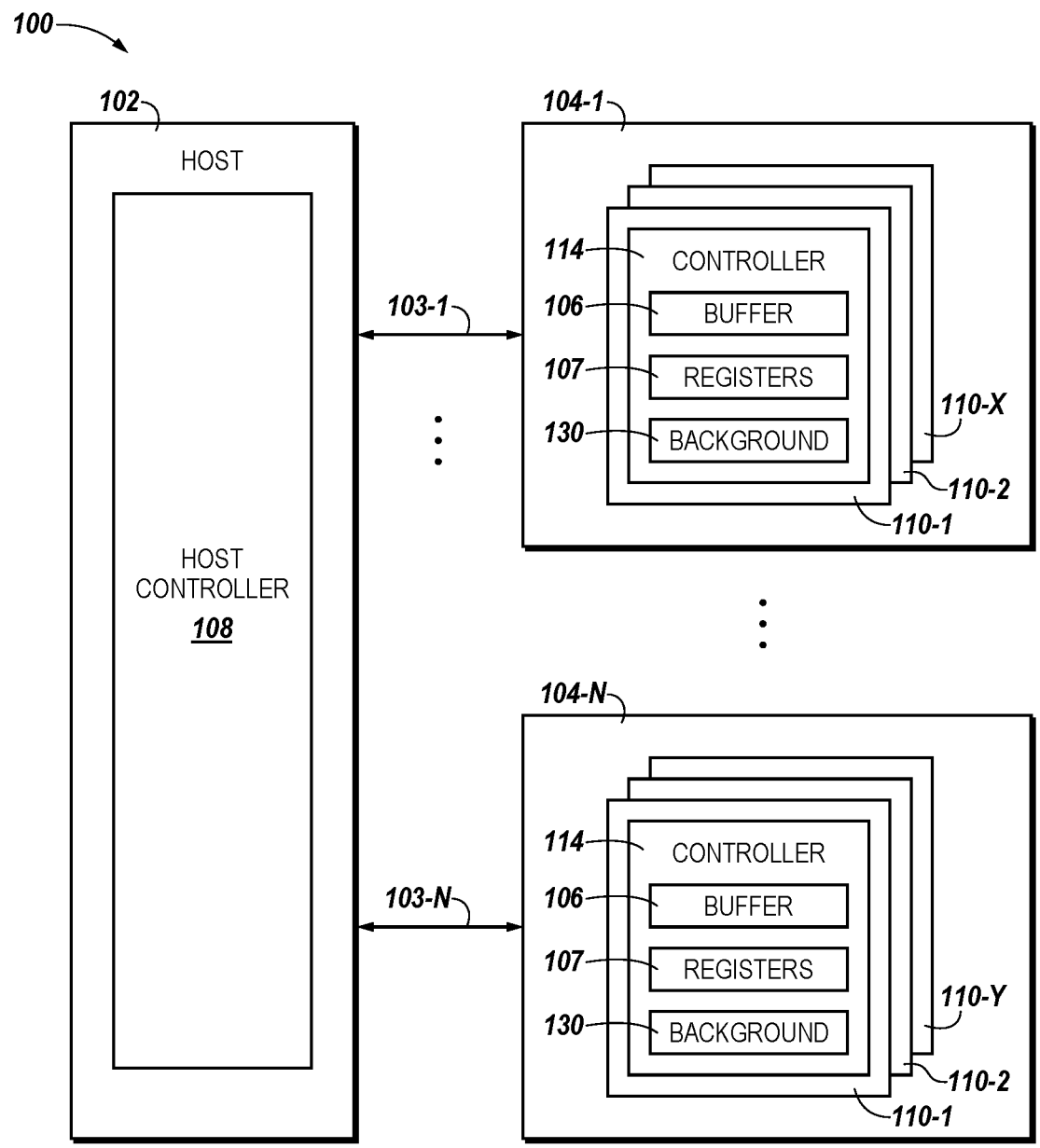
FIG. 1A is a block diagram of an apparatus in the form of a computing system including a memory system in accordance with a number of embodiments of the present disclosure.

The present disclosure includes apparatuses and methods related to performing background operations in memory. An example apparatus can include a first memory device, wherein the first memory device includes an array of memory cells and a controller configured to perform a background operation on the first memory device in response to detecting a command from a host to a second memory device.

In a number of embodiments, the controller can perform background operations on the DIMM. For example, the controller can be configured to perform a background operation on a memory device of the DIMM. The controller can perform the background operation on the memory device in response to the memory device being idle. The memory device can be idle when the memory device is not executing a command from the host, for example.

In some examples, the controller can perform the background operation on the memory device in response to the host sending non-target commands and/or when non-target commands are being executed. For example, a non-target command can be a command to a different device that is not the memory device. The command can be directed to a different device to perform a read operation and the memory device can perform a background operation in response to the host sending the command to the different device, for example.

A memory system can include a dual in-line memory module (DIMM) having a number of memory devices. For example, a DIMM can be a non-volatile DIMM (NVDIMM) that includes a number of volatile memory devices and a number of non-volatile memory devices. A DIMM can execute commands to transfer data between the host and the volatile memory device, between the host and the non-volatile memory device, between the volatile and non-volatile memory devices, between non-volatile memory devices, and between volatile memory devices. The commands can be received by the DIMM from another device, such as a host, and/or can be generated by a controller on the DIMM.

For example, the number of volatile memory devices can be coupled to another device, such as a host, via a first port (e.g., a A Side Port) and be coupled to a controller on the DIMM via a second port (e.g., a B Side Port). The number of non-volatile memory devices can be coupled to the controller on the DIMM. The DIMM can execute commands to transfer data between another device, such as a host, and the volatile memory devices via a A Side Port and the DIMM can execute commands to transfer data between the volatile memory devices and the non-volatile memory devices via a B Side Port. The DIMM can execute the commands to transfer data between another device and the volatile memory devices while executing the commands to transfer data between the volatile memory device and the non-volatile memory devices.

The DIMM can include a number of embodiments where a port is not used to couple the volatile memory devices to other devices and/or the controller (e.g., a bus from a host and/or controller is coupled directly to the volatile memory devices). The DIMM can send a ready/wait signal to another device, such as a host, indicating whether or not the DIMM is ready to receive commands from the another device. For example, the DIMM can send a ready/wait signal to a host indicating the DIMM is not ready to receive commands from the host and is busy executing commands to transfer data between the memory devices on the DIMM. The DIMM can send a ready/wait signal to a host indicating the DIMM is ready to receive commands from the host when the DIMM is not busy executing commands to transfer data between the memory device on the DIMM.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1A-7 use a DIMM as the memory module, but the embodiments of the present disclosure can be used on any memory system that include volatile and/or non-volatile memory. In FIG. 1A, memory system 104-1 is coupled to the host via channel 103-1 can include DIMMs 110-1, . . . , 110-X, where DIMM 110-1 is a NVDIMM and 110-X is DRAM DIMM. In this example, each DIMM 110-1, . . . , 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 103-1 . . . 103-N. The host controller 108 can communicate with the DIMMs 110-1, . . . , 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 103-1 . . . 103-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) and/or a field programmable gate array (FPGA) coupled to a printed circuit board including a physical interface. Also, each DIMM 110-1, . . . , 110-X, 110-Y can include buffers 116 of volatile and/or non-volatile memory, registers 107, and background operations 130. Buffer 106 can be used to buffer data that is used during execution of commands.

The controller 114 can perform background operations 130 on one or more of the DIMMs 110-1, ..., 110-X, 110-Y. The controller 114 can perform background operations on the one or more DIMMs 110-1, ..., 110-X, 110-Y in response to the one or more DIMMs being idle 110-1, ..., 110-X, 110-Y. In some examples the controller 114 can perform background operations on the one or more DIMMs 110-1, ..., 110-X, 110-Y in response to the host 102 sending a command to a different memory device. The one or more DIMMs 110-1, ..., 110-X, 110-Y can stop performing the background operations 130 in response to the different memory device completing execution of the command.

The different device can use the full bandwidth of the one or more channels 103-1 ... 103-N. The one or more DIMMs 110-1, ..., 110-X, 110-Y can be isolated from the host 102 in response to detecting a command from the host 102 to the different memory device. In some examples, the background operations 130 can be performed in response to the one or more DIMMs 110-1, ..., 110-X, 110-Y being isolated from the host 102.

The DIMMs 110-1, ..., 110-X, 110-Y can provide main memory for the memory system or could be used as additional memory or storage throughout the memory system. Each DIMM 110-1, ..., 110-X, 110-Y can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 ... 104-N can include address circuitry to latch address signals provided over I/O connections through I/O circuitry. Address signals can be received and decoded by a row decoder and a column decoder to access the DIMMs 110-1, ..., 110-X, 110-Y. It will be appreciated by those skilled in the art that the number of address input connections can depend on the density and architecture of the DIMMs 110-1, ..., 110-X, 110-Y.

Figure 1B:
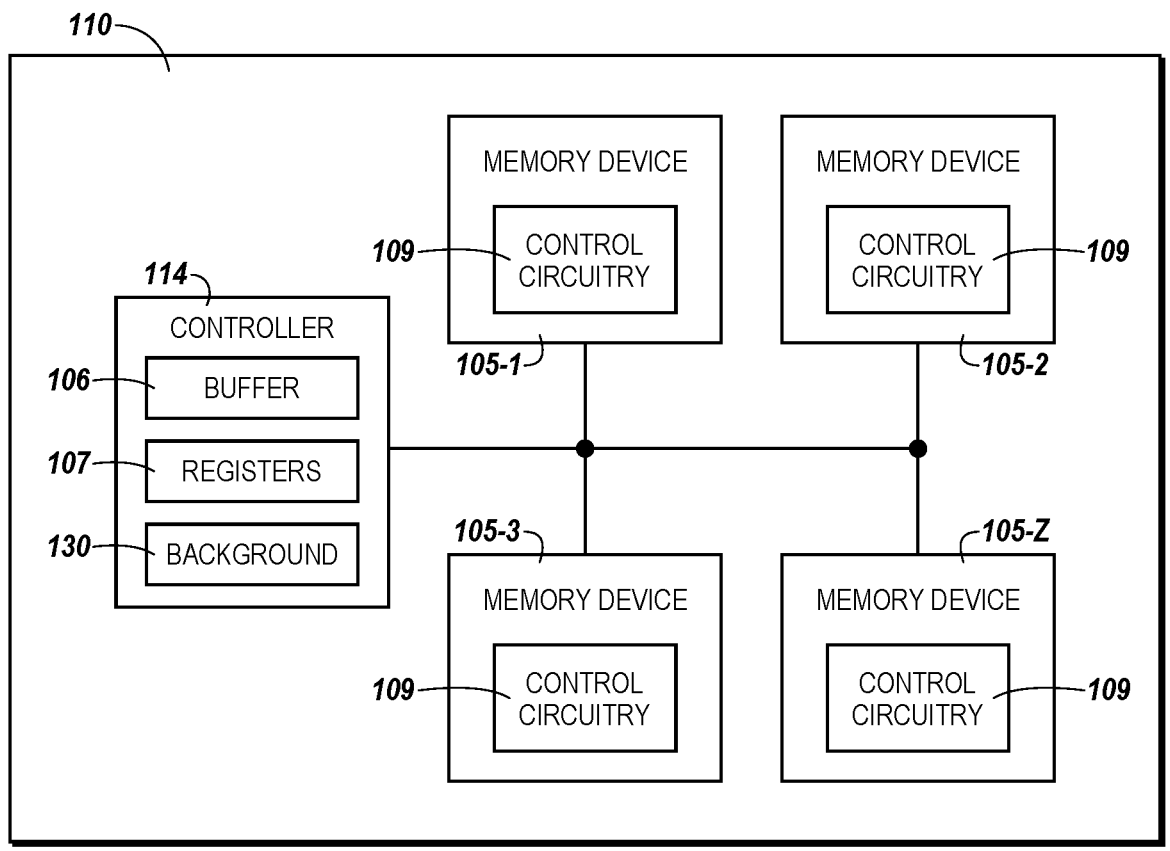
FIG. 1B is a block diagram of an apparatus in the form of a dual in-line memory modules (DIMM) in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include a controller 114. Controller 114 can include memory, such as SRAM memory, that can be a buffer 106, a number of registers 107, and background operations 130. DIMM 110 can include a number of memory devices 105-1, ..., 105-Z coupled to the controller. Memory devices 105-1, ..., 105-Z can be volatile and/or non-volatile memory devices, such as memory devices 221 and 224 in FIG. 2, and include non-volatile memory arrays and/or volatile memory arrays. Memory devices 105-1, ..., 105-Z can include control circuitry 109 (e.g., hardware, firmware, and/or software) which can be used to execute commands on the memory devices 105-1, ..., 105-Z. The control circuitry 109 can receive commands from controller 114. The control circuitry 109 can be configured to execute commands to read and/or write data in the memory devices 105-1, ..., 105-Z.

Figure 2:
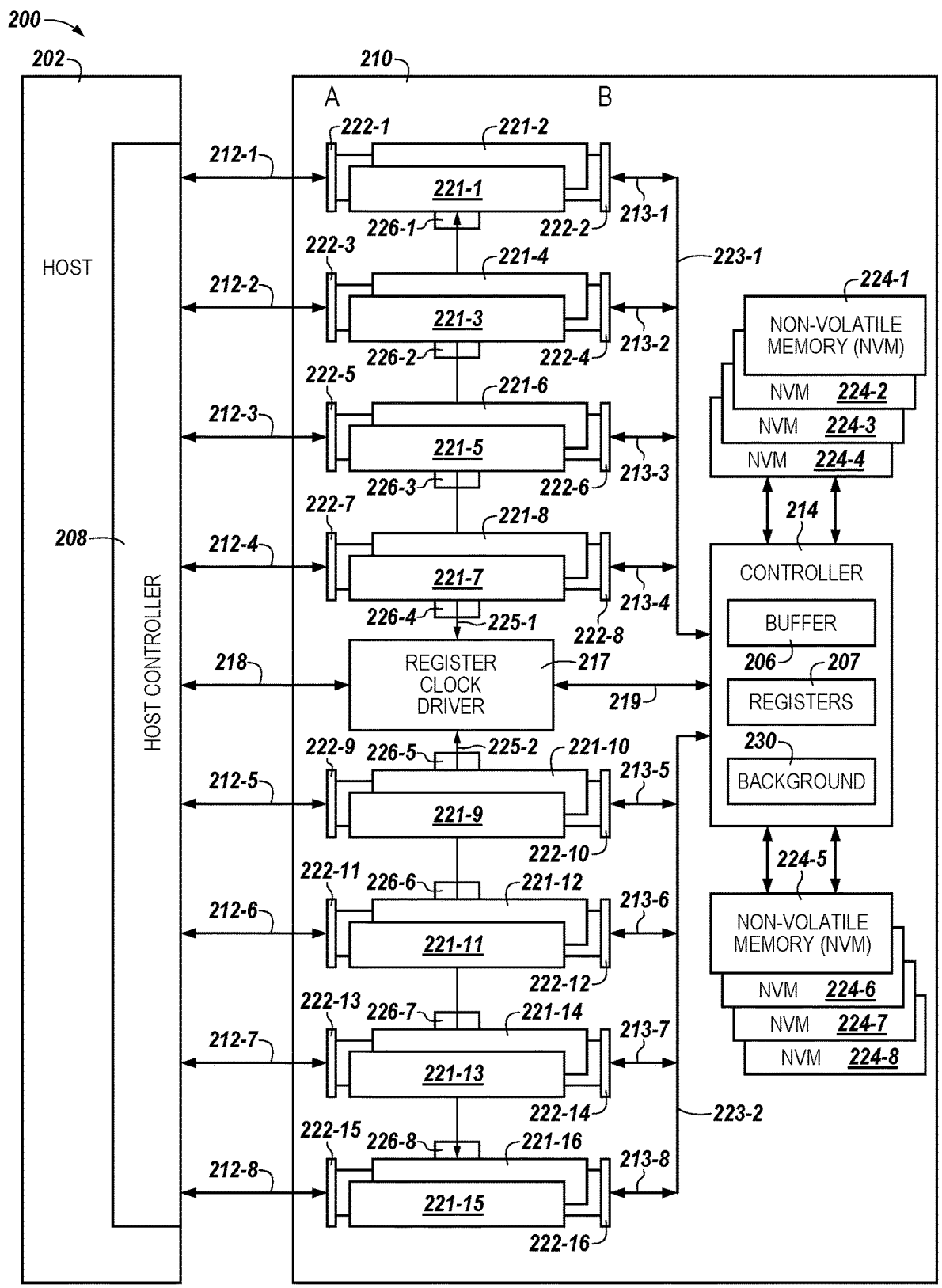
FIG. 2 is a block diagram of a computing system including a host and a memory system comprising a dual in-line memory module (DIMM) with ports in accordance with a number of embodiments of the present disclosure.

FIG. 2 is a block diagram of a computing system 200 including a host 202 and a memory system comprising a dual in-line memory module (DIMM) 210 with ports in accordance with a number of embodiments of the present disclosure. In FIG. 2, host 202 is coupled to DIMM 210 via data buses 212-1, ..., 212-16 and command/address buses 218-1 and 218-2. Host 202 can be coupled to DIMM 210 via a number of channels (e.g., channels 103-1, ..., 103-N in FIG. 1A). For example, host 202 is coupled to DIMM 210 via a first channel that includes data buses 212-1, ..., 212-4 and command/address bus 218 and host 202 is coupled to DIMM 210 via a second channel that includes data buses 212-5, ..., 212-8 and command address/bus 2188. Host 202 can send commands on the first channel for execution on memory devices 221-1, ..., 221-8 and memory devices 224-1, ..., 224-4 and can send commands on the second channel for execution on memory devices 221-9, ..., 221-16 and memory devices 224-5, ..., 224-8. Controller 214 can receive commands from host 202. The commands from host 202 can be sent to register clock driver (RCD) 217 via bus 218 and the commands can be sent from RCD 217 to controller 214 via bus 219. The controller 214 can receive the commands from RCD 217 and store data associated with the commands (e.g., command instructions and/or data read from and/or to be written to memory devices 221 and/or 224 during execution of the commands) in buffer 206. Controller 214 can send a signal to RCD 217 indicating which memory device of a pair of memory devices (e.g., memory device 221-1 or 221-2, for example) will execute the command. The signal can be sent from RCD 217 to multiplexor 226-1, ..., 226-8 and cause multiplexor 226-1, ..., 226-8 to select a memory device from a pair of memory devices and couple the selected memory device to RCD 217 via bus 225-1 and/or 225-2. For example, if the command is transferring data via an A side port and the A side port is coupling memory device 221-1 to host 202, while the B side port is coupling memory device 221-2 to controller 214, the signal can indicate to multiplexor 226-1 to couple bus 225-1 to memory device 221-1. The controller can then send the command to memory device 221-1 on bus 225-1 via RCD 217 and memory device 221-1 can execute the command by transferring data between memory device 221-1 and host 202. Memory devices 221-1, ..., 221-16 can send signals, (e.g., command completion signals) on buses 225-1 and 225-2 to RCD 217 and controller 214 that indicate memory devices 221-1, ..., 221-16 have completed execution of commands and are ready for additional commands. Once a command has been executed, controller 214 can send another command to RCE 217 for execution and/or a status signal to the host 202 indicating that the command received from host 202 has been executed. Controller 214 can include non-volatile and/or volatile memory, such as SRAM memory, that can be a buffer 206, a register 207 used during execution of commands, and/or background operations 230 to be performed by the memory devices 224-1, ..., 224-8.

DIMM 210 can include a first number of memory devices 221-1, ..., 221-16. For example, memory devices 221-1, ..., 221-16 can be DRAM memory devices, among other types of volatile and/or non-volatile memory. The DRAM memory devices 221-1, ..., 221-16 can be paired together. For example, DRAM memory devices 221-1 and 221-2 are paired together, coupled to the host via port 222-1 (A Side Port) and buses 212-1 and 212-2, and coupled to controller 214 via port 222-2 (B Side Port) and buses 213-1, 213-2, 223-1, and 223-2. DRAM memory devices 221-3 and 221-4 are paired together, coupled to the host via port 222-3 (A Side Port) and buses 212-3 and 212-4, and coupled to controller 214 via port 222-4 (B Side Port) and buses 213-3, 213-4, 223-1, and 223-2. DRAM memory devices 221-5 and 221-6 are paired together, coupled to the host via port 222-5

(A Side Port) and buses 212-5 and 212-6, and coupled to controller 214 via port 222-6 (B Side Port) and buses 213-5, 213-6, 223-1, and 223-2. DRAM memory devices 221-7 and 221-8 are paired together, coupled to the host via port 222-7 (A Side Port) and buses 212-7 and 212-8, and coupled to controller 214 via port 222-8 (B Side Port) and buses 213-7, 213-8, 223-1, and 223-2. DRAM memory devices 221-9 and 221-10 are paired together, coupled to the host via port 222-9 (A Side Port) and buses 212-9 and 212-10, and coupled to controller 214 via port 222-10 (B Side Port) and buses 213-9, 213-10, 223-3, and 223-4. DRAM memory devices 221-11 and 221-12 are paired together, coupled to the host via port 222-11 (A Side Port) and buses 212-11 and 212-12, and coupled to controller 214 via port 222-12 (B Side Port) and buses 213-11, 213-12, 223-3, and 223-4. DRAM memory devices 221-13 and 221-14 are paired together, coupled to the host via port 222-13 (A Side Port) and buses 212-13 and 212-14, and coupled to controller 214 via port 222-14 (B Side Port) and buses 213-13, 213-14, 223-3, and 223-4. DRAM memory devices 221-15 and 221-16 are paired together, coupled to the host via port 222-15 (A Side Port) and buses 212-15 and 212-16, and coupled to controller 214 via port 222-16 (B Side Port) and buses 213-15, 213-16, 223-3, and 223-4.

DIMM 210 can include a second number of memory devices 224-1, . . . , 224-8. For example, memory devices 221-1, . . . , 221-8 can be 3D XPoint memory devices, among other types of volatile and/or non-volatile memory.

Memory system 200 can be configured to execute commands sent from host 202 to DIMM 210 by sending command/address information from the host controller 208 on command/address busses 213-1 and 213-2 to the register clock driver (RCD) 217 and data on data buses 212-1, . . . , 212-16. The commands from the host can include address information for memory devices 221-1, . . . 221-16 where the host is requesting an operation on data at a particular location in memory devices 221-1, . . . 221-16. The commands from the host can include address information for memory devices 224-1, . . . , 224-8 where the host is requesting an operation on data at particular location in memory devices 224-1, . . . , 224-8, while memory devices 221-1, . . . 221-16 can act as a buffer during execution of the commands.

In a number of embodiments, memory devices 221-1, . . . 221-16 can be configured as cache. For example, memory devices can be configured as cache for the data stored in memory devices 224-1, . . . , 224-8 and/or other memory devices coupled to the computing system. The DIMM 210 can be configured to have a portion of memory devices 221-1, . . . 221-16 addressable by host 202 and a portion of the memory devices 221-1, . . . 221-16 configured as cache.

DIMM 210 includes memory devices that are paired together and one of the paired memory devices can be selected for coupling to host 202 via an A Side Port and the other of the paired memory device can be selected for coupling to controller 214 via a B Side Port. For example, memory devices 221-1, which is paired with memory device 221-2, can be selected for coupling to host 202 via port 222-1, while memory device 221-2 can be selected for coupling to controller 214 via port 222-2. Port 222-1 can include a multiplexor to select and couple memory device 221-1 to host 202 while isolating memory device 221-2 from host 202. Port 222-2 can include a multiplexor to select and couple memory device 221-2 to controller 214 while isolating memory device 221-1 from controller 214. Host 202 can send command to DIMM 210 for execution on the selected A Side Port memory device (e.g., memory device 221-1). The commands can be executed by transferring data between host 202 and memory device 221-1 via port 222-1 on buses 212-1 and/or 212-2. DIMM 210 can also execute commands for execution on the selected B Side Port memory device (e.g., memory device 221-2). The commands can be executed by transferring data between memory device 221-2 and other memory devices via port 222-1 and controller 214 on buses 212-1, 212-2, 223-1, and/or 223-2. Commands executed using the B Side Port can transfer data between memory devices 221-1, . . . , 221-16 and/or between memory devices 221-1, . . . , 221-16 and memory devices 224-1, . . . , 224-8. Ports 222-1, . . . , 22-16 can be external to memory devices 221-1, . . . , 221-16 as illustrated in FIG. 2.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 224-1, . . . , 224-8. For example, after A Side Port and B Side Port transfers have occurred on a pair of memory devices and DIMM 210 is idle, controller 214 can send commands to reconcile the data stored on the pair of memory devices so that the same data is stored on each of the memory devices by transferring data between the pair of memory devices and/or between the pair of memory devices and memory devices 224-1, . . . , 224-8.

In a number of embodiments, commands can be received from host 202 and/or generated by controller 214 to transfer data between memory devices 224-1, . . . , 224-8. Data can be transferred between memory devices 224-1, . . . , 224-8 via controller 214 using buffer 206 and/or registers 207.

In a number of embodiments, the controller 214 can be configured to perform a background operation 230 on one or more memory devices 224-1, . . . , 224-8. The controller 214 can perform the background operation 230 on the one or more memory devices 224-1, . . . , 224-8 in response to the one or more memory devices 224-1, . . . , 224-8 being idle. The one or more memory devices 224-1, . . . , 224-8 can be idle when the one or more memory devices 224-1, . . . , 224-8 are not executing a command from the host 202.

In some examples, the controller 214 can perform the background operation 230 on the one or more memory devices 224-1, . . . , 224-8 in response to the host 202 sending non-target commands and/or when non-target commands are being executed. For example, a non-target command can be a command to one or more memory devices 221-1, . . . , 221-16 that are not the one or more memory devices 224-1, . . . , 224-8. The command can be directed to a memory device 221-1 to perform a read operation and the memory device 224-1 can perform a background operation 230 in response to the host 202 sending the command to the memory device 221-1, for example.

In a number of embodiments, the one or more memory devices 224-1, . . . , 224-8 can stop performing the background operation 230 in response to the one or more memory devices 221-1, . . . , 221-16 completing execution of the command.

The one or more memory devices 224-1, . . . , 224-8 can be isolated from the host 202 in response to detecting a command from the host 202 to the one or more memory devices 221-1, . . . , 221-16. One or more multiplexors 226-1, . . . , 226-8 can isolate the one or more memory devices 224-1, . . . , 224-8 from the host 202. In some examples, the background operation 230 can be performed in response to the one or more memory devices 224-1, . . . , 224-8 being isolated from the host 202. For example, memory device 224-1 can be isolated from the host 202 by multiplexor 226-1 in response to detecting a command from the host 202 directed to the memory device 221-1.

In a number of embodiments, the one or more memory devices 224-1, . . . , 224-8 can receive a different command from the host 202. The one or more memory devices 224-1, . . . , 224-8 can delay execution of the different command until the command to the one or more memory devices 221-1, . . . , 221-15 is complete.

Figure 3:
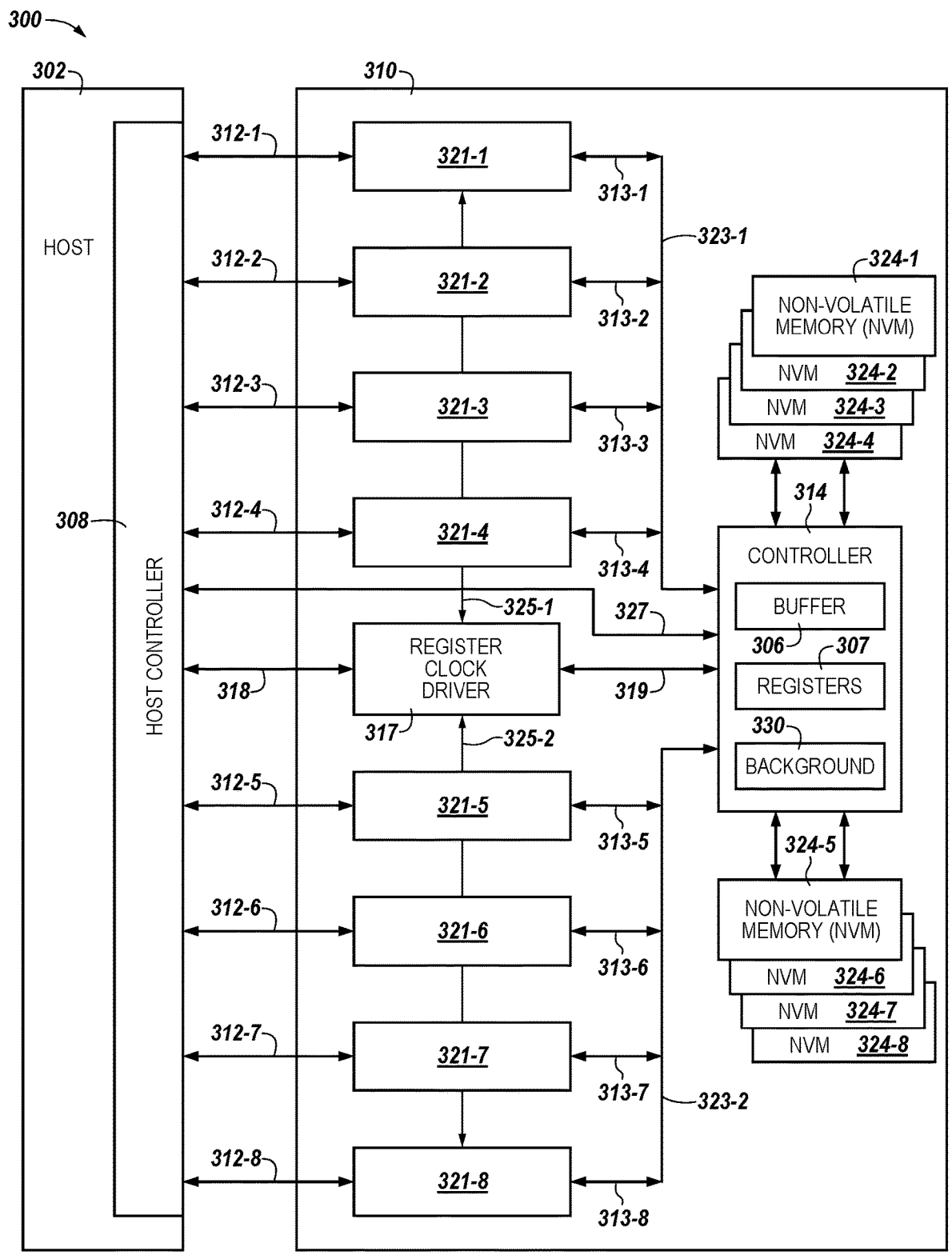
FIG. 3 is a block diagram of a computing system including a host and a memory system comprising a dual in-line memory module (DIMM) with a ready/busy bus in accordance with a number of embodiments of the present disclosure.

FIG. 3 is a block diagram of a computing system 300 including a host 302 and a memory system comprising a dual in-line memory module (DIMM) 310 with a ready/busy bus in accordance with a number of embodiments of the present disclosure. In FIG. 3, host 302 is coupled to DIMM 310 via data buses 312-1, . . . , 312-16, command/address bus 318, and ready/busy bus 327. Host 302 can be coupled to DIMM 310 via a number of channels (e.g., channels 103-1, . . . , 103-N in FIG. 1A). For example, host 302 is coupled to DIMM 310 via a first channel that includes data buses 312-1, . . . , 312-4, command/address bus 318, and ready/busy bus 327; and host 302 is coupled to DIMM 310 via a second channel that includes data buses 312-5, . . . , 312-8, command address/bus 318, and ready/busy bus 327.

DIMM 310 can include a first number of memory devices 321-1, . . . , 321-8. For example, memory devices 321-1, . . . , 321-16 can be DRAM memory devices, among other types of volatile and/or non-volatile memory. DIMM 310 can include a second number of memory devices 324-1, . . . , 324-8. For example, memory devices 321-1, . . . , 321-8 can be 3D XPoint memory devices, among other types of volatile and/or non-volatile memory.

Controller 314 can send a ready/busy signal to host 302 on the ready/busy bus 327. The ready/busy signal can indicate to host 302 whether or not the controller is ready to receive commands from host 302. For example, if DIMM 310 is busy executing commands, such as transferring data between memory devices 321-1, . . . , 321-4 and memory devices 324-1, . . . , 324-4, for example, the DIMM and is not ready to receive commands, so a ready/busy signal can be sent on ready/busy bus 327 to host 302 that indicates DIMM 310 is not ready to receive commands. Once DIMM 310 is no longer busy executing commands DIMM 310 can send a ready/busy signal on ready/busy bus 327 to host 302 indicating DIMM 310 is ready to receive commands from host 302. Host 302 can send commands to DIMM 310 in response to receiving the ready/busy signal.

Controller 314 can receive commands from host 302. The commands from host 302 can be sent to register clock driver (RCD) 317 via bus 318 and the commands can be sent from RCD 317 to controller 314 via bus 319. Controller 314 can receive the commands from RCD 317 and store data associated with the commands (e.g., command instructions and/or data read from and/or to be written to memory devices 321 and/or 324 during execution of the commands) in buffer 306. The controller can send the commands to memory devices 321-1, . . . , 321-8 on bus 325-1 and/or 325-2 via RCD 317 and memory devices 321-1, . . . , 321-8 can execute the commands by transferring data between memory devices 321-1, . . . , 321-8 and host 302 and/or memory devices 321-1, . . . , 321-8 and memory device 324-1, . . . , 324-8. Memory devices 321-1, . . . , 321-8 can send signals on buses 325-1 and 325-2 to RCD 317 and controller 314 that indicate memory devices 321-1, . . . , 321-8 have completed execution of commands and are ready for additional commands. Once a command has been executed, controller 314 can send a status signal to the host 302 indicating that the command received from host 302 has been executed. Controller 314 can include non-volatile and/or volatile memory, such as SRAM memory, that can be a buffer 306, a register 307 used during execution of commands, and background operations 330 to be performed by the memory devices 324-1, . . . , 324-8.

Memory system 300 can be configured to execute commands sent from host 302 to DIMM 310 by sending command/address information from the host controller 308 on command/address bus 318 to the register clock driver (RCD) 317 and data on data buses 312-1, . . . , 312-8. The commands from the host can include address information for memory devices 321-1, . . . 321-8 where the host is requesting an operation on data at particular location in memory devices 321-1, . . . 321-16. The commands from the host can include address information for memory devices 324-1, . . . , 324-4 where the host is requesting an operation on data at particular location in memory devices 324-1, . . . , 324-4, while memory devices 321-5, . . . 321-8 can act as a buffer during execution of the commands.

In a number of embodiments, memory devices 321-1, . . . 321-8 can be configured as cache. For example, memory devices can be configured as cache for the data stored in memory devices 324-1, . . . , 324-8 and/or other memory devices coupled to the computing system. The DIMM 310 can be configured to have a portion of memory devices 321-1, . . . 321-8 addressable by host 302 and a portion of the memory devices 321-1, . . . 321-8 configured as cache.

In a number of embodiments, commands can be received from host 302 and/or generated by controller 314 to transfer data between memory devices 324-1, . . . , 324-8. Data can be transferred between memory devices 324-1, . . . , 324-8 via controller 314 using buffer 306 and/or registers 307.

Figure 4:
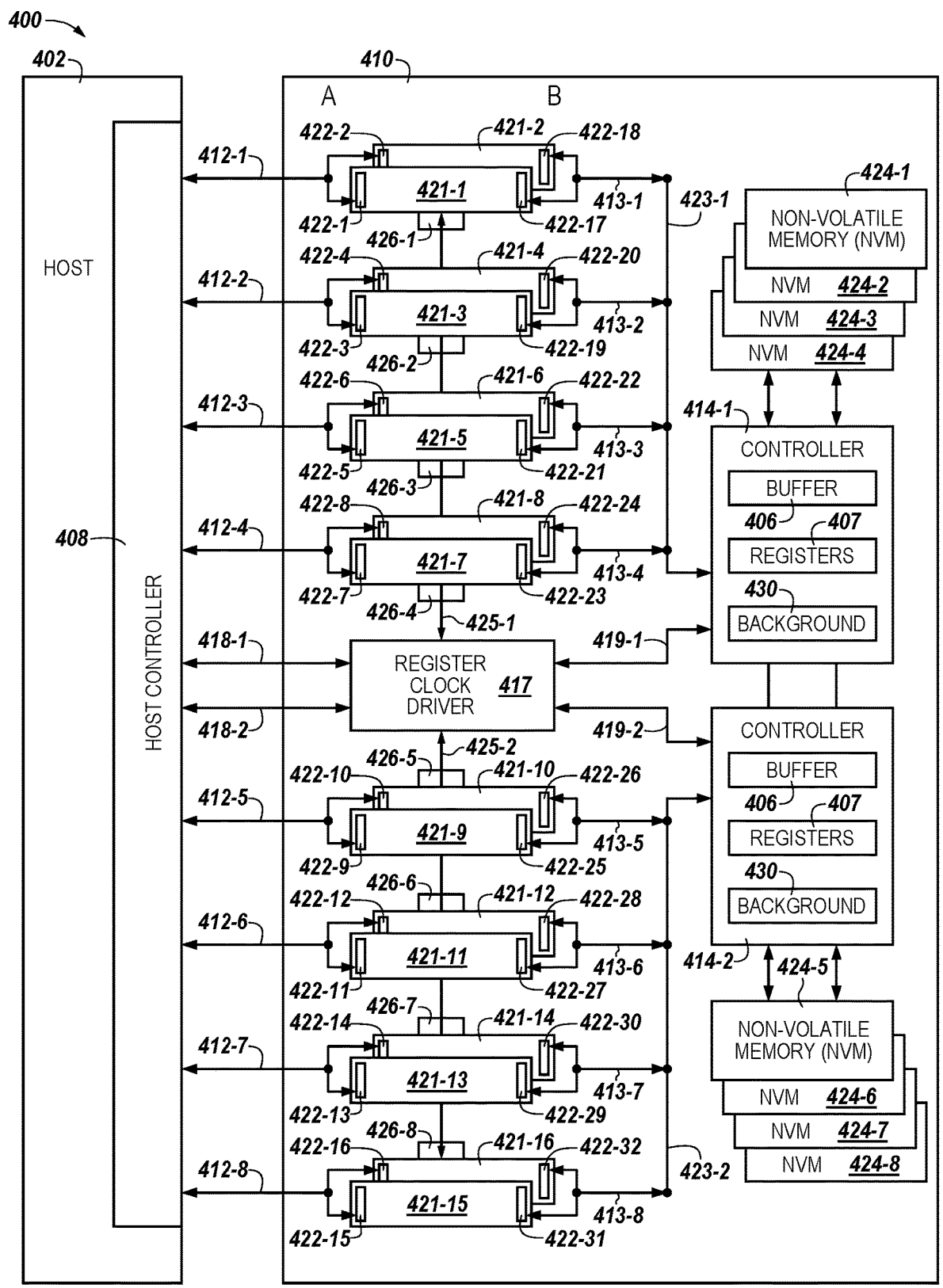
FIG. 4 is a block diagram of a computing system including a host and a memory system comprising a dual in-line memory module (DIMM) with a first and second controller in accordance with a number of embodiments of the present disclosure.

FIG. 4 is a block diagram of a computing system 400 including a host 402 and a memory system comprising a dual in-line memory module (DIMM) 410 with a first and second controller in accordance with a number of embodiments of the present disclosure. In FIG. 4, host 402 is coupled to DIMM 210 via data buses 412-1, . . . , 412-8 and command/address buses 418-1 and 418-2. Host 402 can be coupled to DIMM 410 via a number of channels (e.g., channels 103-1, . . . , 103-N in FIG. 1A). For example, host 402 is coupled to DIMM 410 via a first channel that includes data buses 412-1, . . . , 412-4 and command/address bus 418-1 and host 402 is coupled to DIMM 410 via a second channel that includes data buses 412-5, . . . , 412-9 and command address/bus 418-2. Host 402 can send commands on the first channel for execution on memory devices 421-1, . . . , 421-8 and memory devices 424-1, . . . , 424-4 and can send commands on the second channel for execution on memory devices 421-9, . . . , 421-16 and memory devices 424-5, . . . , 424-8. Controller 414-1 can receive commands from host 402 on channel 1 and controller 414-2 can receive commands from 402 on channel 2. The commands from host 402 can be sent to register clock driver (RCD) 417 via buses 418-1 and/or 418-2 and the commands can be sent from RCD 417 to controller 414-1 via bus 419-1 and controller 414-2 via bus 419-2.

DIMM 410 can include controller 414-1 and 414-2. Controller 414-1 can be coupled to and send signals to control operation of memory devices 421-1, . . . , 421-8 and memory devices 424-1, . . . , 424-4. Controller 414-2 can be coupled to and send signals to control operation of memory devices 421-9, . . . , 421-16 and memory devices 424-8, . . . , 424-8. DIMM 410 with controllers 414-1 and 414-2 can allow memory devices 421-1, . . . , 421-8 and memory devices 424-1, . . . , 424-4 to operation independently from memory devices 421-9, . . . , 421-16 and memory devices 424-8, . . . , 424-8. Controller 414-1 is coupled to controller 414-2 can data can be transferred between controller 414-1 and 414-2. Therefore controller 414-1 can operate memory devices 421-1, . . . , 421-8 and memory devices 424-1, . . . , 424-4 independently from other memory device and also transfer data from memory devices 421-1, . . . , 421-8 and memory devices 424-1, . . . , 424-4 to other memory devices, such as memory devices 421-9, . . . , 421-16 and memory devices 424-8, . . . , 424-8.

The controller 414 can receive the commands from RCD 417 and store data associated with the commands (e.g., command instructions and/or data read from and/or to be written to memory devices 421 and/or 424 during execution of the commands) in buffer 406. Controller 414 can send a signal to RCD 417 indicating which memory device of a pair of memory devices (e.g., memory device 421-1 or 421-2, for example) will execute the command. The signal can be sent from RCD 217 to multiplexor 426-1, . . . , 426-8 and cause multiplexor 426-1, . . . , 426-8 to select a memory device from a pair of memory devices and couple the selected memory device to RCD 417 via bus 425-1 and/or 425-2. For example, if the command is transferring data via an A side port and the A side port is coupling memory device 421-1 to host 402, while the B side port is coupling memory device 421-2 to controller 414, the signal can indicate to multiplexor 426-1 to couple bus 425-1 to memory device 421-1. The controller can then send the command to memory device 421-1 on bus 425-1 via RCD 417 and memory device 421-1 can execute the command by transferring data between memory device 421-1 and host 402. Memory devices 421-1, . . . , 421-16 can send signals on buses 425-1 and 425-2 to RCD 417 and controller 414 that indicate memory devices 421-1, . . . , 421-16 have completed execution of commands and are ready for additional commands. Once a command has been executed, controller 414 can send a status signal to the host 402 indicating that the command received from host 402 has been executed. Controllers 414-1 and 414-2 can include non-volatile and/or volatile memory, such as SRAM memory, that can be a buffer 406, a register 407 used during execution of commands, and/or background operations 430 to be performed on the memory devices 424-1, . . . , 424-8.

DIMM 410 can include a first number of memory devices 421-1, . . . 421-16. For example, memory devices 421-1, . . . 421-16 can be DRAM memory devices, among other types of volatile and/or non-volatile memory. The DRAM memory devices 421-1, . . . 421-16 can be paired together. For example, DRAM memory devices 421-1 and 421-2 are paired together, coupled to the host via ports 422-1 and 422-2 (A Side Ports) and bus 412-1, and coupled to controller 414-1 via ports 422-17 and 422-18 (B Side Ports) and buses 413-1 and 423-1. DRAM memory devices 421-3 and 421-4 are paired together, coupled to the host via ports 422-3 and 422-3 (A Side Ports) and bus 412-2, and coupled to controller 414-1 via ports 422-19 and 422-20 (B Side Ports) and buses 413-2 and 423-1. DRAM memory devices 421-5 and 421-6 are paired together, coupled to the host via ports 422-5 and 422-6 (A Side Ports) and bus 412-3, and coupled to controller 414-1 via ports 422-21 and 422-22 (B Side Ports) and buses 413-3 and 423-1. DRAM memory devices 421-7 and 421-8 are paired together, coupled to the host via ports 422-7 and 422-8 (A Side Ports) and buses 412-4, and coupled to controller 414-1 via ports 422-23 and 422-24 (B Side Ports) and buses 413-4 and 423-1. DRAM memory devices 421-9 and 421-10 are paired together, coupled to the host via ports 422-9 and 422-10 (A Side Ports) and bus 412-5, and coupled to controller 414-2 via ports 422-25 and 42-26 (B Side Ports) and buses 413-5 and 423-2. DRAM memory devices 421-11 and 421-12 are paired together, coupled to the host via ports 422-11 and 422-12 (A Side Ports) and bus 412-6, and coupled to controller 414-2 via ports 422-27 and 422-28 (B Side Ports) and buses 413-6 and 423-2. DRAM memory devices 421-13 and 421-14 are paired together, coupled to the host via ports 422-13 and 422-14 (A Side Ports) and bus 412-7, and coupled to controller 414-2 via ports 422-29 and 422-30 (B Side Ports) and buses 413-7 and 423-2. DRAM memory devices 421-15 and 421-16 are paired together, coupled to the host via ports 422-15 and 422-16 (A Side Ports) and bus 412-8, and coupled to controller 414-2 via ports 422-31 and 422-32 (B Side Ports) and buses 413-8 and 423-2.

DIMM 410 can include a second number of memory devices 424-1, . . . 424-8. For example, memory devices 421-1, . . . 421-8 can be 3D XPoint memory devices, among other types of volatile and/or non-volatile memory.

Memory system 400 can be configured to execute commands sent from host 402 to DIMM 210 by sending command/address information from the host controller 408 on command/address busses 413-1 and 413-2 to the register clock driver (RCD) 217 and data on data buses 412-1, . . . , 412-16. The commands from the host can include address information for memory devices 421-1, . . . 421-16 where the host is requesting an operation on data at particular location in memory devices 421-1, . . . 421-16. The commands from the host can include address information for memory devices 424-1, . . . , 424-8 where the host is requesting an operation on data at particular location in memory devices 424-1, . . . , 424-8, while memory devices 421-1, . . . 421-16 can act as a buffer during execution of the commands.

In a number of embodiments, memory devices 421-1, . . . 421-16 can be configured as cache. For example, memory devices can be configured as cache for the data stored in memory devices 424-1, . . . , 424-8 and/or other memory devices coupled to the computing system. The DIMM 410 can be configured to have a portion of memory devices 421-1, . . . 421-16 addressable by host 402 and a portion of the memory devices 421-1, . . . 421-16 configured as cache.

DIMM 410 includes memory devices that are paired together and one of the paired memory devices can be selected for coupling to host 402 via an A Side Port and the other of the paired memory device can be selected for coupling to controller 414 via a B Side Port. For example, memory devices 421-1, which is paired with memory device 421-2, can be selected for coupling to host 402 via port 422-1, while memory device 421-2 can be selected for coupling to controller 414-1 via port 422-2. Port 422-1 can include a multiplexor to select and couple memory device 421-1 to host 402 while isolating memory device 421-2 from host 402. Port 422-2 can include a multiplexor to select and couple memory device 421-2 to controller 414-1 while isolating memory device 421-1 from controller 414. Host 402 can send command to DIMM 210 for execution on the selected A Side Port memory device (e.g., memory device 421-1). The commands can be executed by transferring data between host 402 and memory device 421-1 via port 422-1 on buses 412-1 and/or 412-2. DIMM 210 can also execute commands for execution on the selected B Side Port memory device (e.g., memory device 421-2). The commands can be executed by transferring data between memory device 421-2 and other memory devices via port 422-1 and controller 414-1 on buses 412-1, 412-2, 423-1, and/or 423-2. Commands executed using the B Side Port can transfer data between memory devices 421-1, . . . , 421-16 and/or between memory devices 421-1, . . . , 421-16 and memory devices 424-1, . . . , 424-8. Ports 422-1, . . . , 422-32 can be external to memory devices 421-1, . . . , 421-16 as illustrated in FIG. 4.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 424-1, . . . , 424-8. For example, after A Side Port and B Side Port transfers have occurred on a pair of memory devices and DIMM 210 is idle, controllers 414-1 and 414-2 can send commands to reconcile the data stored on the pair of memory devices so that the same data is stored on each of the memory devices by transferring data between the pair of memory devices and/or between the pair of memory devices and memory devices 424-1, . . . , 424-8.

In a number of embodiments, commands can be received from host 402 and/or generated by controllers 414-1 and 414-2 to transfer data between memory devices 424-1, . . . , 424-8. Data can be transferred between memory devices 424-1, . . . , 424-8 via controllers 414-1 and 414-2 using buffer 406 and/or registers 407.

In a number of embodiments, the controller 414-1 can be configured to perform background operations 430 on one or more memory devices 424-1, . . . , 424-4. The controller 414-1 can perform the background operations 430 on the one or more memory devices 424-1, . . . , 424-4 in response to the one or more memory devices 424-1, . . . , 424-4 being idle. In some examples, the controller 414-1 can perform the background operations 430 on the one or more memory devices 424-1, . . . , 424-4 in response to the host 402 sending a command to one or more memory devices 421-1, . . . , 421-8. The command can be to a memory device 421-1 to refresh the memory device 421-1 and the memory device 424-1 can perform a background operation 430 in response to the host 402 sending the command to the memory device 421-1. In some examples, the one or more memory devices 424-1, . . . , 424-4 can stop performing the background operations 430 in response to the one or more memory devices 421-1, . . . , 421-8 completing execution of the command.

The one or more memory devices 424-1, . . . , 424-4 can be isolated from the host 402 in response to detecting a command from the host 402 directed to the one or more memory devices 421-1, . . . , 421-8. One or more multiplexors 426-1, . . . , 426-4 can isolate the one or more memory devices 424-1, . . . , 424-4 from the host 402. In some examples, the background operation 430 can be performed in response to the one or more memory devices 424-1, . . . , 424-4 being isolated from the host 402. For example, memory device 424-1 can be isolated from the host 402 by multiplexor 426-1 in response to detecting a command from the host 402 directed to the memory device 421-1.

In a number of embodiments, the one or more memory devices 424-1, . . . , 424-4 can receive a different command from the host 402. The one or more memory devices 424-1, . . . , 424-4 can delay execution of the different command until the command to the one or more memory devices 421-1, . . . , 421-8 is complete.

In a number of embodiments, the controller 414-2 can be configured to perform background operations 430 on one or more memory devices 424-5, . . . , 424-8. The controller 414-2 can perform the background operations 430 on the one or more memory devices 424-5, . . . , 424-8 in response to the one or more memory devices 424-5, . . . , 424-8 being idle. In some examples, the controller 414-2 can perform the background operations 430 on the one or more memory devices 424-5, . . . , 424-8 in response to the host 402 sending a command to one or more memory devices 421-9, . . . , 421-16. The command can be directed to a memory device 421-9 to perform a read operation and the memory device 424-5 can perform a background operation 430 in response to the host 402 sending the command to the memory device 421-9. In some examples, the one or more memory devices 424-5, . . . , 424-8 can stop performing the background operations 430 in response to the one or more memory devices 421-9, . . . , 421-16 completing execution of the command.

The one or more memory devices 424-5, . . . , 424-8 can be isolated from the host 402 in response to detecting a command from the host 402 to the one or more memory devices 421-9, . . . , 421-16. One or more multiplexors 426-5, . . . , 426-8 can isolate the one or more memory devices 424-5, . . . , 424-8 from the host 402. In some examples, the background operation 430 can be performed in response to the one or more memory devices 424-5, . . . , 424-8 being isolated from the host 402. For example, memory device 424-5 can be isolated from the host 402 by multiplexor 426-5 in response to detecting a command from the host 402 to the memory device 421-9.

In a number of embodiments, the one or more memory devices 424-5, . . . , 424-8 can receive a different command from the host 402. The one or more memory devices 424-5, . . . , 424-8 can delay execution of the different command until the command to the one or more memory devices 421-9, . . . , 421-16 is complete.

Figure 5:
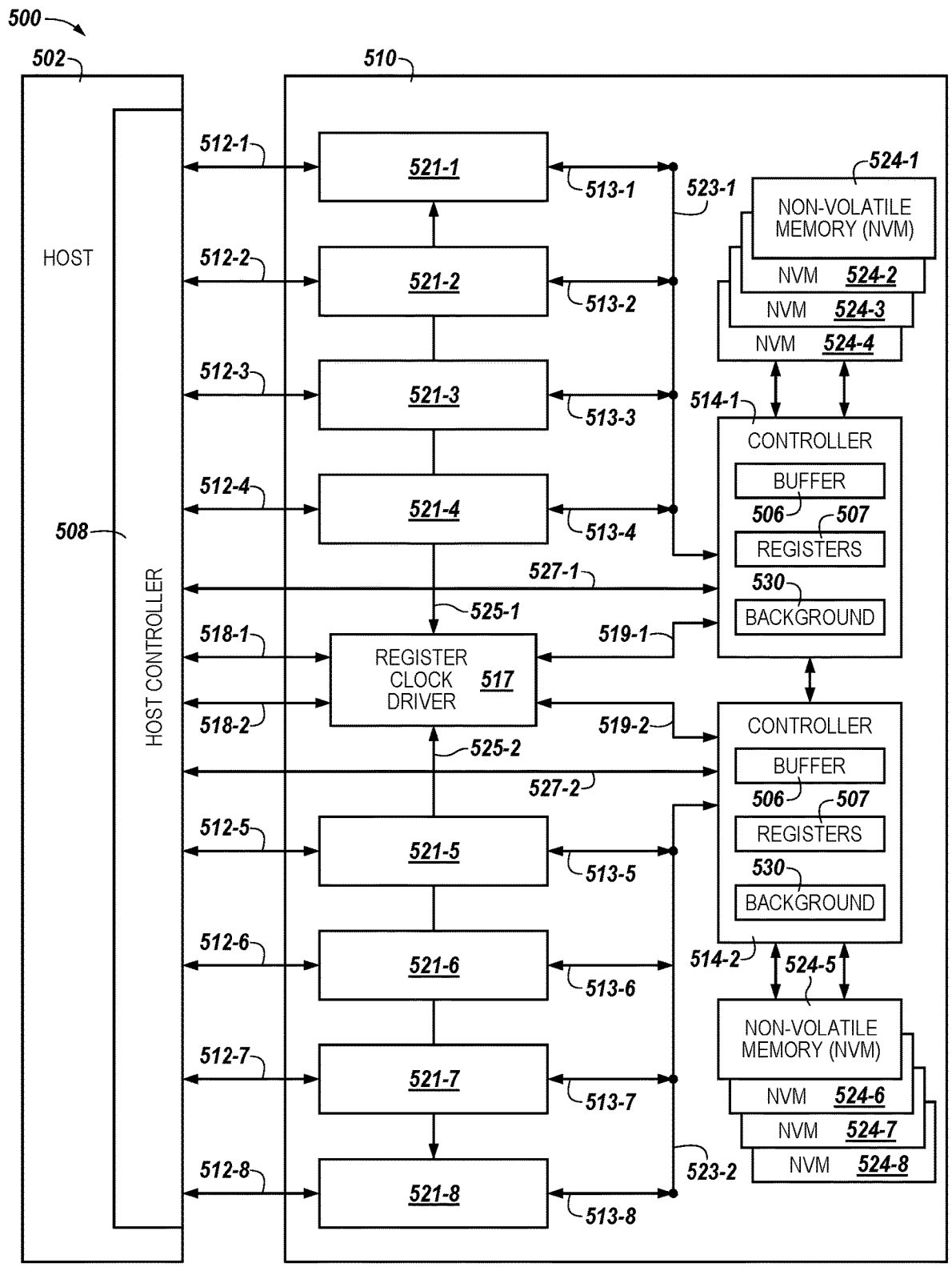
FIG. 5 is a block diagram of a computing system including a host and a memory system comprising a dual in-line memory module (DIMM) with a first and second controller and a first and second ready/busy bus in accordance with a number of embodiments of the present disclosure.

FIG. 5 is a block diagram of a computing system 500 including a host 502 and a memory system comprising a dual in-line memory module (DIMM) 510 with a first and second controller and a first and second ready/busy bus in accordance with a number of embodiments of the present disclosure. In FIG. 5, host 502 is coupled to DIMM 510 via data buses 512-1, . . . , 512-16, command/address buses 518-1 and 518-2, and ready/busy buses 527-1 and 527-2. Host 502 can be coupled to DIMM 510 via a number of channels (e.g., channels 103-1, . . . , 103-N in FIG. 1A). For example, host 502 is coupled to DIMM 510 via a first channel that includes data buses 512-1, . . . , 512-4, command/address bus 518-1, and ready/busy bus 527-1; and host 502 is coupled to DIMM 510 via a second channel that includes data buses 512-5, . . . , 512-8, command address/bus 518-2, and ready/busy bus 527-2. Controller 514-1 can receive commands from host 502 on channel 1 and controller 514-2 can receive commands from host 502 on channel 2. The commands from host 502 can be sent to register clock driver (RCD) 517 via buses 518-1 and/or 518-2 and the commands can be sent from RCD 517 to controller 514-1 via bus 519-1 and controller 514-2 via bus 519-2.

DIMM 510 can include controller 514-1 and 514-2. Controller 514-1 can be coupled to and send signals to control operation of memory devices 521-1, . . . , 521-4 and memory devices 424-1, . . . , 424-4. Controller 514-2 can be coupled to and send signals to control operation of memory devices 521-5, . . . , 521-8 and memory devices 524-5, . . . , 524-8. DIMM 510 with controllers 514-1 and 514-2 can allow memory devices 521-1, . . . , 521-4 and memory devices 524-1, . . . , 524-4 to operation independently from memory devices 521-5, . . . , 521-8 and memory devices 524-5, . . . , 524-8. Controller 514-1 is coupled to controller 514-2 and data can be transferred between controller 514-1 and 514-2. Therefore controller 514-1 can operate memory devices 521-1, . . . , 521-4 and memory devices 524-1, . . . , 524-4 independently from other memory device and also transfer data from memory devices 521-1, . . . , 521-4 and memory devices 524-1, . . . , 524-4 to other memory devices, such as memory devices 521-5, . . . , 451-8 and memory devices 524-5, . . . , 524-8.

DIMM 510 can include a first number of memory devices 521-1, . . . , 521-8. For example, memory devices 521-1, . . . , 521-8 can be DRAM memory devices, among other types of volatile and/or non-volatile memory. DIMM 510 can include a second number of memory devices 524-1, . . . , 524-8. For example, memory devices 521-1, . . . , 521-8 can be 3D XPoint memory devices, among other types of volatile and/or non-volatile memory.

Controllers 514-1 and 514-2 can send a ready/busy signal to host 502 on the ready/busy buses 527-1 and 524-2, respectively. The ready/busy signal can indicate to host 502 whether or not the controller 514-1 and/or 514-2 is ready to receive commands from host 502. For example, if controller 514-1 on DIMM 510 is busy executing commands, such as transferring data between memory devices 521-1, . . . , 521-4 and memory devices 524-1, . . . , 524-4 the controller 514-1 is not ready to receive commands on channel 1, but controller 514-2 could receive commands on channel 2. A ready/busy signal can be sent by controller 514-1 on ready/busy bus 527-1 to host 502 that indicates controller 514-1 is not ready to receive commands on channel 1 and a ready/busy signal can be sent by controller 514-2 on ready/busy bus 527-2 to host indicating controller 514-2 is ready to receive command from host 502 on channel 2. Host 502 can send commands on the second channel to controller 514-2 for execution on memory device 521-5, . . . , 521-8 and/or memory devices 524-5, . . . , 524-8. Once controller 514-1 is no longer busy executing commands, such as commands that transfer data on memory device associated with channel 1, controller 514-1 can send a ready/busy signal on ready/busy bus 527-1 to host 502 indicating controller 514-1 is ready to receive commands from host 502 on channel 1. Host 502 can send commands to controller 514-1 on channel 1 in response to receiving the ready/busy signal.

Controllers 514-1 and 514-2 can receive commands from host 502. The commands from host 502 can be sent to register clock driver (RCD) 517 via buses 518-1 and/or 518-2 and the commands can be sent from RCD 517 to controllers 514-1 and 514-2 via buses 519-1 and/or 519-2, respectively. Controllers 514-1 and 514-2 can receive the commands from RCD 517 and store data associated with the commands (e.g., command instructions and/or data read from and/or to be written to memory devices 521 and/or 524 during execution of the commands) in buffer 506. Controllers 514-1 and 514-2 can send the commands to memory devices 521-1, . . . , 521-8 on bus 525-1 and/or 525-2 via RCD 517 and memory devices 521-1, . . . , 521-8 can execute the commands by transferring data between memory devices 521-1, . . . , 521-8 and host 502 and/or memory devices 521-1, . . . , 521-8 and memory device 524-1, . . . , 524-8. Memory devices 521-1, . . . , 521-8 can send signals on buses 525-1 and 525-2 to RCD 517 and controllers 514-1 and 514-2 that indicate memory devices 521-1, . . . , 521-8 have completed execution of commands and are ready for additional commands. Once a command has been executed, controllers 514-1 and 514-2 can send a status signal to the host 502 indicating that the command received from host 502 has been executed. Controllers 514-1 and 514-2 can include non-volatile and/or volatile memory, such as SRAM memory, that can be a buffer 506, a register 507 used during execution of commands, and/or background operations 530 to be performed on the memory devices 524-1, . . . , 524-8.

Memory system 500 can be configured to execute commands sent from host 502 to DIMM 510 by sending command/address information from the host controller 508 on command/address bus 518 to the register clock driver (RCD) 517 and data on data buses 512-1, . . . , 512-8. The commands from the host can include address information for memory devices 521-1, . . . 521-8 where the host is requesting an operation on data at particular location in memory devices 521-1, . . . 521-16. The commands from the host can include address information for memory devices 524-1, . . . , 524-4 where the host is requesting an operation on data at particular location in memory devices 524-1, . . . , 524-4, while memory devices 521-5, . . . 521-8 can act as a buffer during execution of the commands.

In a number of embodiments, memory devices 521-1, . . . 521-8 can be configured as cache. For example, memory devices can be configured as cache for the data stored in memory devices 524-1, . . . , 524-8 and/or other memory devices coupled to the computing system. The DIMM 510 can be configured to have a portion of memory devices 521-1, . . . 521-8 addressable by host 502 and a portion of the memory devices 521-1, . . . 521-8 configured as cache.

In a number of embodiments, commands can be received from host 502 and/or generated by controllers 514-1 and 514-2 to transfer data between memory devices 524-1, . . . , 524-8. Data can be transferred between memory devices 524-1, . . . , 524-8 via controllers 514-1 and 514-2 using buffers 506 and/or registers 507.

The controllers 514-1 and 514-2 can be configured to perform background operations 530 on the memory devices 524-1, . . . , 524-8. For example, the controller 514-1 can perform a background operation 530 on the memory device 524-1 in response to the controller 514-1 sending a ready/busy signal to the host 502 indicating the controller 514-1 is not ready to receive commands on channel 1.

Figure 6:
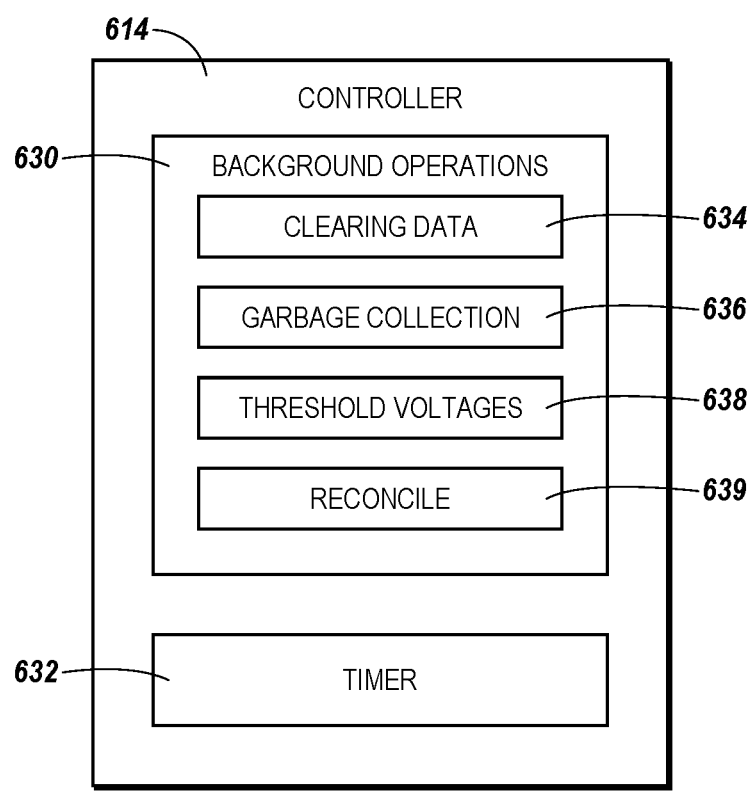
FIG. 6 is a block diagram of a controller including background operations and a time calculator in accordance with a number of embodiments.

In a number of embodiments, the controllers 514-1 and 514-2 can be configured to stop performing background operations 630 on the memory devices 524-1, . . . , 524-8. For example, the controller 514-1 can stop performing a background operation 530 on the memory device 524-1 in response to the controller 514-1 sending a ready/busy signal to the host 502 indicating the controller 514-1 is ready to receive commands on channel 1. FIG. 6 is a block diagram of a controller including background operations and a time calculator in accordance with a number of embodiments.

As discussed, above, the controller 614 can perform background operations 630 on memory devices (e.g., memory devices 524-1, . . . , 524-8 in FIG. 5). The background operations 630 can include clearing data 634. For example, the memory devices can be configured to clear unused data as a background operation 630. A memory device can clear unused data in response to the memory device being idle and/or in response to a host (e.g., host 502 in FIG. 5) sending a command to a different memory device (e.g., memory devices 521-1, . . . , 521-16 in FIG. 5).

The background operations 630 can include performing garbage collection 636 on memory devices (e.g., memory devices 524-1, . . . , 524-8 in FIG. 5). Garbage collection can include moving and/or erasing data to free portions of memory devices for future use. For example, the memory devices can be configured to perform garbage collection 636 in response to the memory device being idle and/or in response to the host (e.g., host 502 in FIG. 5) sending a command to a different memory device (e.g., memory devices 521-1, . . . , 521-16 in FIG. 5).

In a number of embodiments, the background operations 630 can include adjusting threshold voltages 638 of the memory devices (e.g., memory devices 524-1, . . . , 524-8 in FIG. 5). For example, the memory devices can be configured to adjust threshold voltages 638 in response to the memory device being idle and/or in response to the host (e.g., host 502 in FIG. 5) sending a command to a different memory device (e.g., memory devices 521-1, . . . , 521-16 in FIG. 5).

The background operations 630 can also include performing a reconcile operation on the memory devices (e.g., 521-1, . . . , 521-16 in FIG. 5). For example, the memory device (e.g., memory device 521-1 in FIG. 5) can reconcile the data stored on it to match the data stored on its pair (e.g., memory device 521-2 in FIG. 5) by transferring data between the memory device and another memory device (e.g., memory device 524-1 in FIG. 5). The reconcile operation 639 can be done in response to the memory device being idle and/or the host (e.g., host 502 in FIG. 5) sending a command to the pair, for example.

The background operations 630 can be clearing data 634, performing garbage collection 636, adjusting threshold voltages 638, and reconciling data, but the background operations 630 are not limited to these operations.

In a number of embodiments, the controller 614 can include a time calculator 632. As discussed above, the background operations 630 can be performed on a memory device (e.g., memory devices 524-1, . . . , 524-8 in FIG. 5) in response to the host (e.g., host 502 in FIG. 5) sending a command to a different memory device (e.g., memory devices 521-1, . . . , 521-16). The time calculator 632 can be used to calculate the period of time it will take for the different memory device to execute the command. The memory device can choose which background operations to perform and/or what number of background operations to perform based on the period of time it will take for the different memory device to execute the command.

Figure 7:
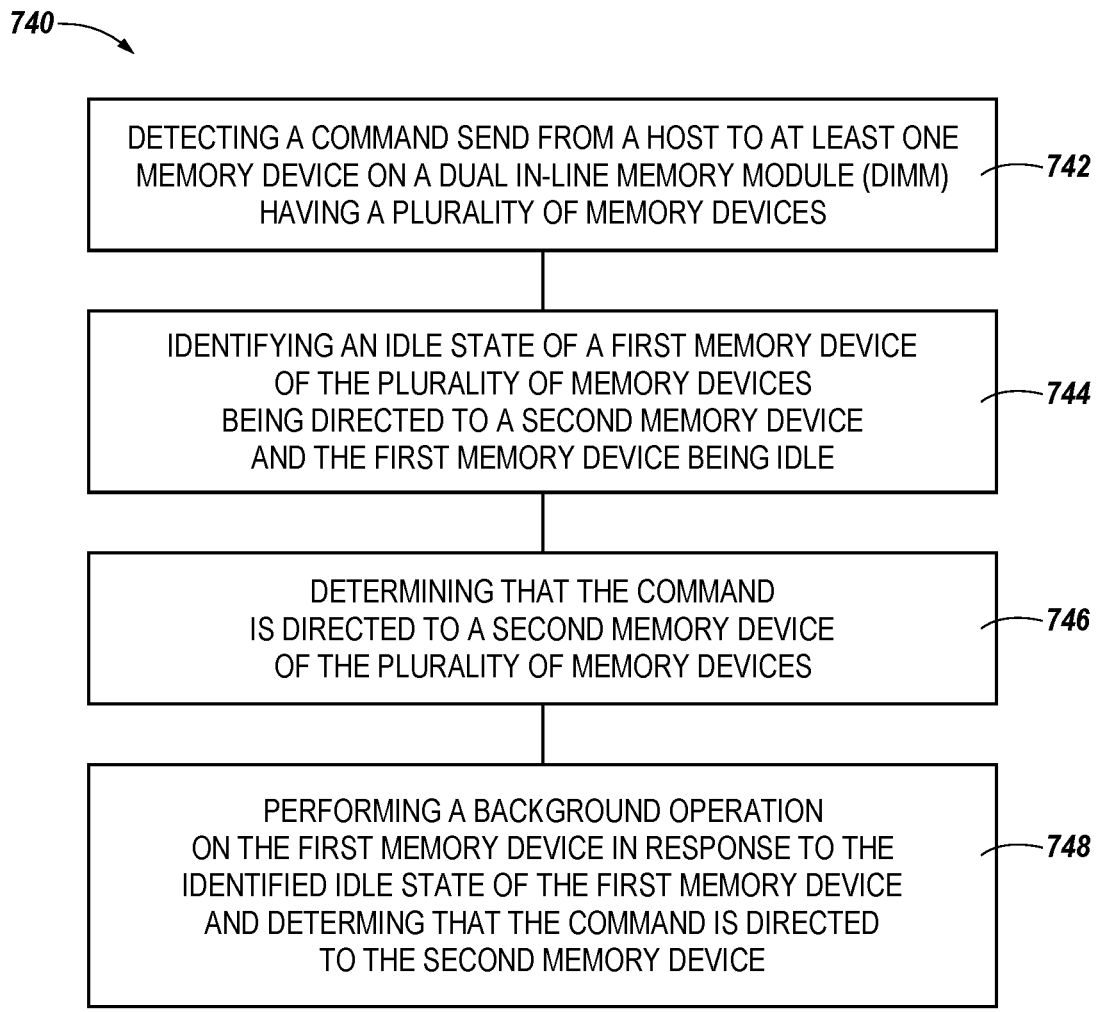
FIG. 7 is a flow diagram illustrating an example of performing a background operation on a memory device in accordance with a number of embodiments of the present disclosure.

FIG. 7 is a flow diagram illustrating an example of performing a background operation on a memory device in accordance with a number of embodiments of the present disclosure. The process described in FIG. 7 can be performed by, for example, a memory device such as memory device 524-1 shown in FIG. 5.

At block 742, the method 740 can include detecting a command sent from a host (e.g., host 502 in FIG. 5) to at least one memory device on a dual in-line memory module (DIMM) having a plurality of memory devices. In some examples, a controller (e.g., controller 514 in FIG. 5) and/or a memory device (e.g., memory device 524-1, . . . , 524-8) can detect the command.

At block 744, the method 740 can further include identifying an idle state of a first memory device (e.g., memory device 524-1 in FIG. 5) of the plurality of memory devices. In some examples, the first memory device can be idle when the first memory device has no commands to perform.

At block 746, the method 740 can further include determining that the command is directed to a second memory device (e.g., memory device 521-1 in FIG. 5) of the plurality of memory devices.

At block 748, the method 740 can further include performing a background operation on the first memory device in response to the identified idle state of the first memory device and determining that the command is directed to the second memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first memory device;
   a multiplexor coupled to the first memory device;
   a register clock driver coupled to the multiplexor;
   a first controller;
   a second controller coupled directly to the first controller and coupled to the first memory device via the register clock driver; and a second memory device directly coupled to the second controller, wherein the second memory device is configured to:
  perform a background operation in response to the multiplexor isolating the second memory device from a host.

2. The apparatus of claim 1, wherein the first controller is busy.

3. The apparatus of claim 2, wherein the first controller is busy in response to a dual in-line memory module (DIMM) executing a command.

4. The apparatus of claim 3, wherein the DIMM includes the first memory device and the second memory device.

5. The apparatus of claim 4, wherein the DIMM executing the command includes the first memory device transferring data to the second memory device.

6. The apparatus of claim 3, wherein the DIMM sends a signal to the host in response to completing the execution of the command.

7. The apparatus of claim 6, wherein the DIMM receives a different command from the host in response to sending the signal.

8. The apparatus of claim 1, wherein the background operation includes performing garbage collection on the second memory device.

9. The apparatus of claim 1, wherein the background operation includes adjusting threshold voltages.

10. The apparatus of claim 1, wherein the background operation includes performing a reconcile operation on the second memory device.

11. The apparatus of claim 10, wherein the reconcile operation includes transferring data between the second memory device and the first memory device.

12. A system, comprising:
  a host; and
  a dual in-line memory module (DIMM) comprising:
    a first memory device;
    a multiplexor coupled to the first memory device;
    a register clock driver coupled to the multiplexor;
    a first controller;
    a second controller coupled directly to the first controller and coupled to the first memory device via the register clock driver; and
    a second memory device directly coupled to the second controller, wherein the second memory device is configured to:
      perform a background operation in response to the multiplexor isolating the second memory device from the host; and
      send a signal to indicate the second memory device is ready to receive commands.

13. The system of claim 12, wherein the second memory device is configured to send the signal to the host in response to the background operation being executed.

14. The system of claim 13, wherein the host is configured to send a command to the second controller via the register clock driver (RCD), a first bus, and a second bus in response to receiving the signal.

15. The system of claim 14, wherein the second controller is configured to send a different command to the first memory device via the RCD in response to receiving the command from the host.

16. A method, comprising:
  performing a background operation on a first memory device coupled to a first controller on a dual in-line memory module (DIMM) in response to a multiplexor, coupled to a second memory device and a register clock driver, isolating the first memory device from a host, wherein the first controller is directly coupled to a second controller; and
  sending a signal to the host to indicate the first memory device is ready to receive commands in response to performing the background operation.

17. The method of claim 16, further comprising transferring data between the first memory device and the host in response to receiving a command.

18. The method of claim 16, further comprising transferring data between the first memory device and a third memory device in response to receiving a command.

19. The method of claim 16, further comprising sending a signal from the first memory device to the first controller in response to executing a command.

20. The method of claim 16, further comprising storing data associated with a command in the first memory device or in a third memory device.

* * * * *